United States Patent
Chao

(10) Patent No.: US 10,505,559 B1
(45) Date of Patent: Dec. 10, 2019

(54) PROCESS, VOLTAGE AND TEMPERATURE OPTIMIZED ASYNCHRONOUS SAR ADC

(71) Applicant: IPGREAT INCORPORATED, Grand Cayman (KY)

(72) Inventor: Yuan-Ju Chao, Cupertino, CA (US)

(73) Assignee: IPGreat Incorporated, Grand Cayman (KY)

( * ) Notice: Subject to any disclaimer, the term of this patent is extended or adjusted under 35 U.S.C. 154(b) by 0 days.

(21) Appl. No.: 16/200,655

(22) Filed: Nov. 27, 2018

(51) Int. Cl.
*H03M 1/06* (2006.01)

(52) U.S. Cl.
CPC .................. *H03M 1/0612* (2013.01)

(58) Field of Classification Search
CPC ...... H03M 1/06; H03M 1/0695; H03M 1/124; H03M 1/145; H03M 1/164; H03M 1/468; H03M 1/606; H03M 1/12; H03M 1/46; H03M 1/00; H03M 1/38; H03M 1/462; H03M 1/1009
USPC .......................... 341/118–120, 140–142, 155
See application file for complete search history.

(56) References Cited

U.S. PATENT DOCUMENTS

| | | | | |
|---|---|---|---|---|
| 7,982,518 B1* | 7/2011 | Kaczynski | ................. | G06F 1/04 327/291 |
| 8,786,483 B1* | 7/2014 | Thompson | .......... | H03M 1/0836 341/120 |
| 9,871,529 B1* | 1/2018 | Chong | ..................... | H03M 1/38 |
| 2006/0055574 A1* | 3/2006 | Maksimovic | ......... | G04F 10/005 341/155 |
| 2011/0029266 A1* | 2/2011 | Lee | ........................... | H03F 1/30 702/64 |
| 2013/0076552 A1* | 3/2013 | Nam | ..................... | H03M 1/002 341/164 |
| 2014/0341258 A1* | 11/2014 | Chang | ..................... | G01K 7/01 374/178 |
| 2015/0263756 A1* | 9/2015 | Chiu | ..................... | H03M 1/468 341/118 |
| 2015/0280728 A1* | 10/2015 | Singh | ..................... | H03M 1/462 341/122 |
| 2017/0093418 A1* | 3/2017 | Baek | ..................... | H03M 1/466 |
| 2017/0244424 A1* | 8/2017 | Liu | ........................ | H03M 1/145 |
| 2019/0103879 A1* | 4/2019 | Kinyua | ................. | H03M 1/145 |
| 2019/0131997 A1* | 5/2019 | Liu | ......................... | H03M 1/46 |

* cited by examiner

*Primary Examiner* — Linh V Nguyen

(74) *Attorney, Agent, or Firm* — Tran & Associates

(57) ABSTRACT

A method of enhancing SAR ADC performance includes employing PVT processor to correct process, voltage and temperature (PVT) variation. The PVT processor senses process, supply voltage and temperature information then maximize the time for SAR binary search process. The PVT processor first applies coarse optimization to correct process and voltage variation then applies fine optimization to correct the temperature variation. The SAR ADC is operated at its optimized PVT condition and its performance is enhanced after PVT optimization.

18 Claims, 14 Drawing Sheets

PROCESS, VOLTAGE AND TEMPERATURE OPTIMIZED ASYNCHRONOUS SAR ADC

FIELD OF THE INVENTION

The present invention relates to a successive approximationregister (SAR) analog-to-digital converter (ADC).

BACKGROUND OF THE INVENTION

FIG. 1 shows the block diagram of N-bit a Successive Approximation Register Analog-Digital Converter (SAR ADC) comprising Track/Hold, Comparator, N-bit DAC and Binary Search Logic. The analog input voltage $V_{IN}$ is sampled and held by Track/Hold. The Binary Search Logic is initially set to midscale (100 . . . 00). This forces the DAC output $V_{DAC}$ to be $V_{REF}/2$, where $V_{REF}$ is the reference voltage of ADC. The Comparator compares $V_{IN}$ and $V_{DAC}$ and determines the next operation based on the comparator result. If $V_{IN}$ is greater than $V_{DAC}$, the comparator output is logic high and the MSB of N-bit register remains at 1. Conversely, if $V_{IN}$ is less than $V_{DAC}$, the comparator output is logic low and the MSB is cleared to logic 0. This binary-search process proceeds to the next MSB-1 bit and completes once LSB output is obtained.

FIG. 2 shows the exemplary timing diagram of a conventional synchronous 10-bit SAR ADC. The sampling takes 4 clock cycles and binary search takes 10 clock cycles, each conversion requires 14 clock cycles to be finished. For 100 MSPS conversion rate, the clock frequency is 14 times as 1.4 GHz. Such high frequency clock is often not available on the system. Therefore, for higher conversion rate, asynchronous timing scheme or self-time scheme is employed. Asynchronous timing scheme necessitates a fast internally generated clock. An example of the internal self-timing generation of asynchronous scheme is U.S. Pat. No. 9,774,337 issued Sep. 26, 2017, Chao et al, entitled "High Speed SAR ADC Using Comparator Output Triggered Binary Search Timing Scheme And Bit-Dependent DAC Settling". FIG. 3 illustrates the exemplary timing diagram of asynchronous 10-bit SAR ADC. Half clock cycle time is utilized for the input sampling and half clock cycle is used for 10 binary search bit-tests. The conversion rate equals the input clock rate.

Unlike the bit-test clock has a fixed period in the synchronous scheme, the time period of the asynchronous bit-test clock is not constant since it is generated using delay element. When process speed varies, bit-test clock time period is changing accordingly. FIG. 4 shows the exemplary timing diagram of asynchronous SAR ADC at different process corners. The bit-test clock of slow, typical and fast corners is illustrated. A "done" signal is asserted to indicate that the binary search is complete and the conversion is finished. For the fast process corner, the time delay of delay element is decreased such that the spacing of pulse to pulse is narrowed. The done signal of fast corner is asserted earlier in time than other corners since it finishes bit-test sooner. Specifically, the done signal is asserted at T1, T2 and T3 for slow, typical and fast corners respectively.

The narrower spacing of pulses demands faster DAC settling and Reference settling response. FIG. 5 shows the DAC and Reference settling response of slow and fast process corner respectively. DAC and Reference must settle before the next rising edge of bit-test clock arrives. If DAC or Reference does not settle before the next bit-test arrives, the comparator produces erroneous result and degrades ADC Signal-to-Noise ratio (SNR). The pulse-to-pulse delay $T_{dly1}$ of slow process corner is greater than $T_{dly2}$ of fast process corner. Therefore, the allowed DAC settling time $T_{dac\ settling\ 2}$ at fast corner would be shorter than DAC settling time $T_{dac\ settling\ 1}$ at slow corner. Since the permitted time of fast corner is the most stringent, DAC is required to settle within $T_{dac\ settling\ 2}$ to ensure the fast corner is working properly. This results in consuming more current or power. In other words, the done signal of fast corner is asserted much earlier than the next sample pulse arrives, this is considered inefficiency since the time of half clock cycle is not fully utilized. ADC is not optimized if the timing is compromised to one specific corner condition.

There are three variables that can affect the time delay: Process, Supply Voltage and Temperature (PVT). For the present integrated circuit (IC) manufacture process, the variation of time delay due to process, voltage and temperature is around 55%, 40% and 15% respectively. Considering the two extreme speed corners, the time delay of slow process, low voltage, and high temperature condition can be two to three times of the time delay of fast process, high voltage, and low temperature condition. Often the time delay is constrained by the slow corner owing to the half clock cycle limit, then the time of fast corner is compromised or not optimized. Note that the time delay of delay element is transconductance over capacitor (gm/c) dependent whereas DAC and Reference delay is resistance capacitance product inverse (1/RC) dependent. Although DAC and Reference responds faster at fast corner, the change over process variation for time delay is more than the change over process variation for DAC and Reference.

SUMMARY

A Successive Approximation Register Analog-Digital Converter (SAR ADC), comprising a process, voltage, and temperature (PVT) processor coupled to ADC to optimize over different PVT corners and enhance ADC performance. Implementations of the PVT optimized SAR ADC can include one or more of the following: PVT processor comprises process sensor, temperature sensor, voltage regulator and PVT optimization algorithm. PVT optimization algorithm starts with coarse optimization first and then fine optimization is executed. Coarse optimization rectifies supply voltage variation and corrects process variation by adjusting the coarse clock delay and supply voltage. Fine optimization corrects temperature variation by adjusting the fine clock delay and supply voltage. Process sensor senses the process information and delivers it to coarse optimization. Temperature sensor senses the temperature information and delivers it to fine optimization. Voltage regulator provides supply to ADC and the voltage can be adjusted by coarse step or fine step.

In another aspect, a method to perform Successive Approximation data conversion coupled with PVT processor and optimization algorithm to enhance SAR ADC performance by adjusting the internal self-time clock delay and supply voltage to maximize the time of binary search.

Advantages of the system may include one or more of the following. The supply voltage variation and process variation due to manufacture is rectified by Coarse optimization. The time delay change due to temperature variation is corrected by Fine optimization. Based on the information from process sensor and temperature sensor, PVT optimization algorithm adjusts the bit-test clock delay to maximize the time for binary search. By maximizing the time during binary search, DAC settling and Reference settling is improved and ADC SNR and linearity is enhanced. SAR ADC performance is optimized without compromising to any PVT condition. The system optimizes the timing of asynchronous SAR ADC for different process, voltage, and temperature (PVT) corner. A faster conversion rate, better Figure of Merit (FOM) SAR ADC can be achieved with lower power consumption.

A more complete appreciation of the present invention and its improvements can be obtained by reference to the accompanying drawings, which are briefly summarized below, to the following detailed description of illustrative embodiment of the invention, and to the appended claims.

DETAILED DESCRIPTION

Figure 1:
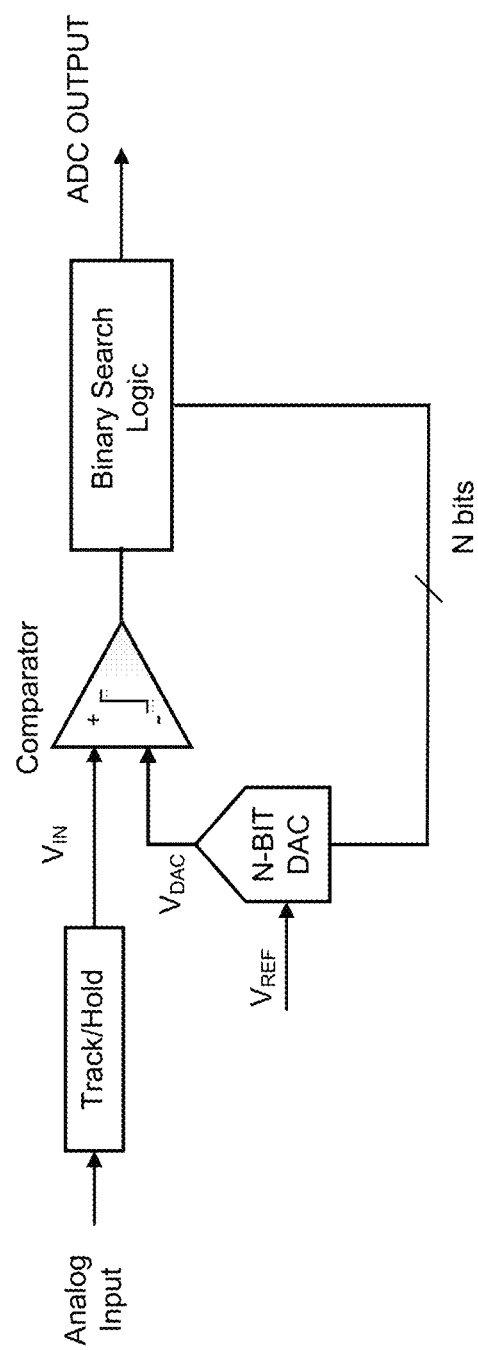
FIG. 1 shows the block diagram of N-bit SAR ADC
Figure 2:
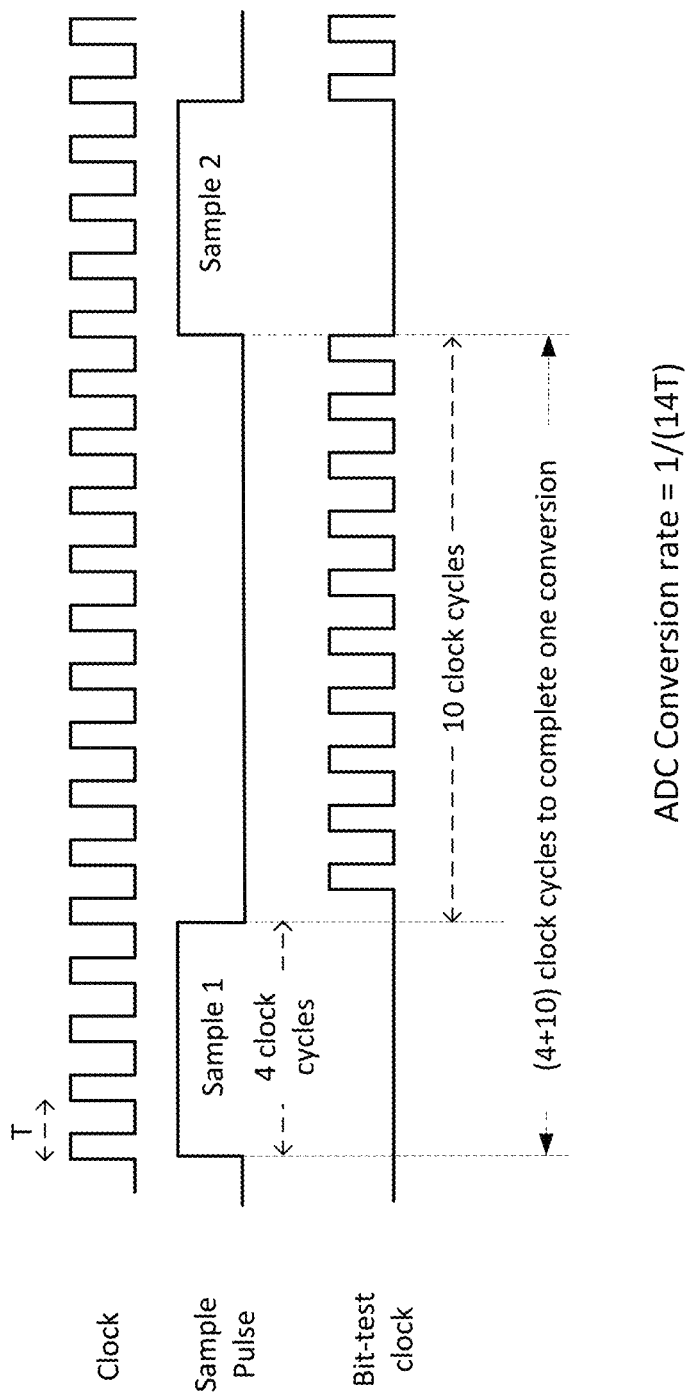
FIG. 2 shows the timing diagram of a conventional synchronous 10-bit SAR ADC
Figure 3:
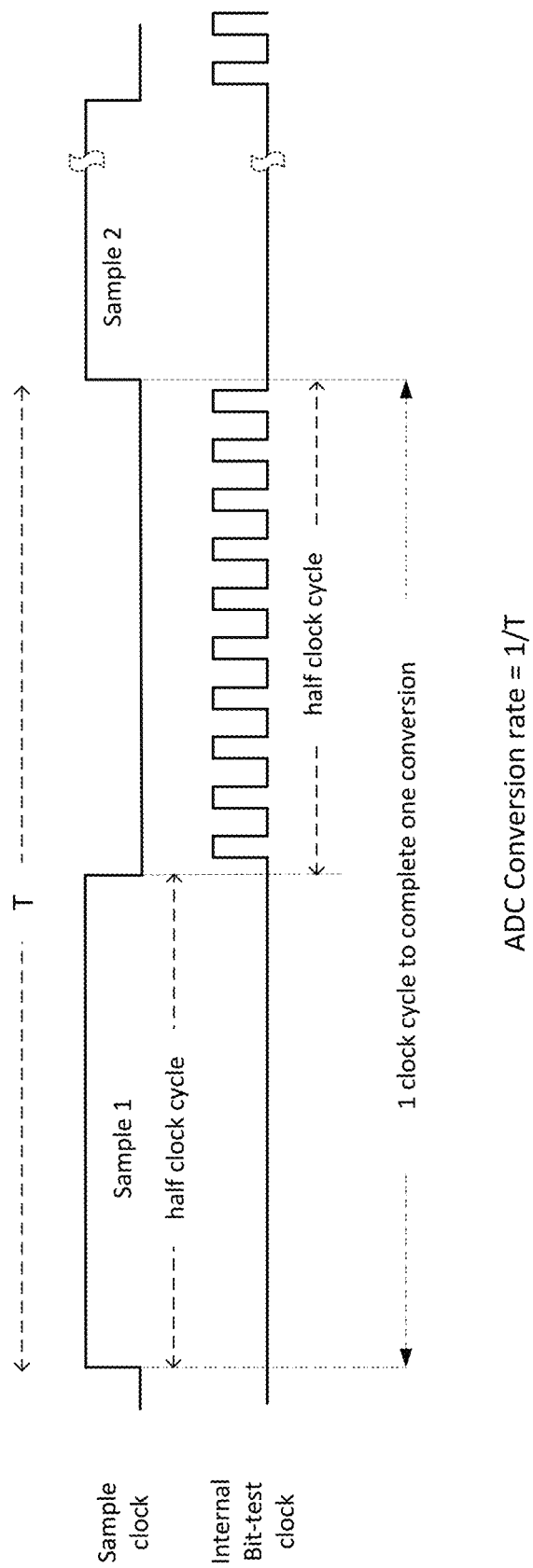
FIG. 3 illustrates the timing diagram of asynchronous 10-bit SAR ADC
Figure 4:
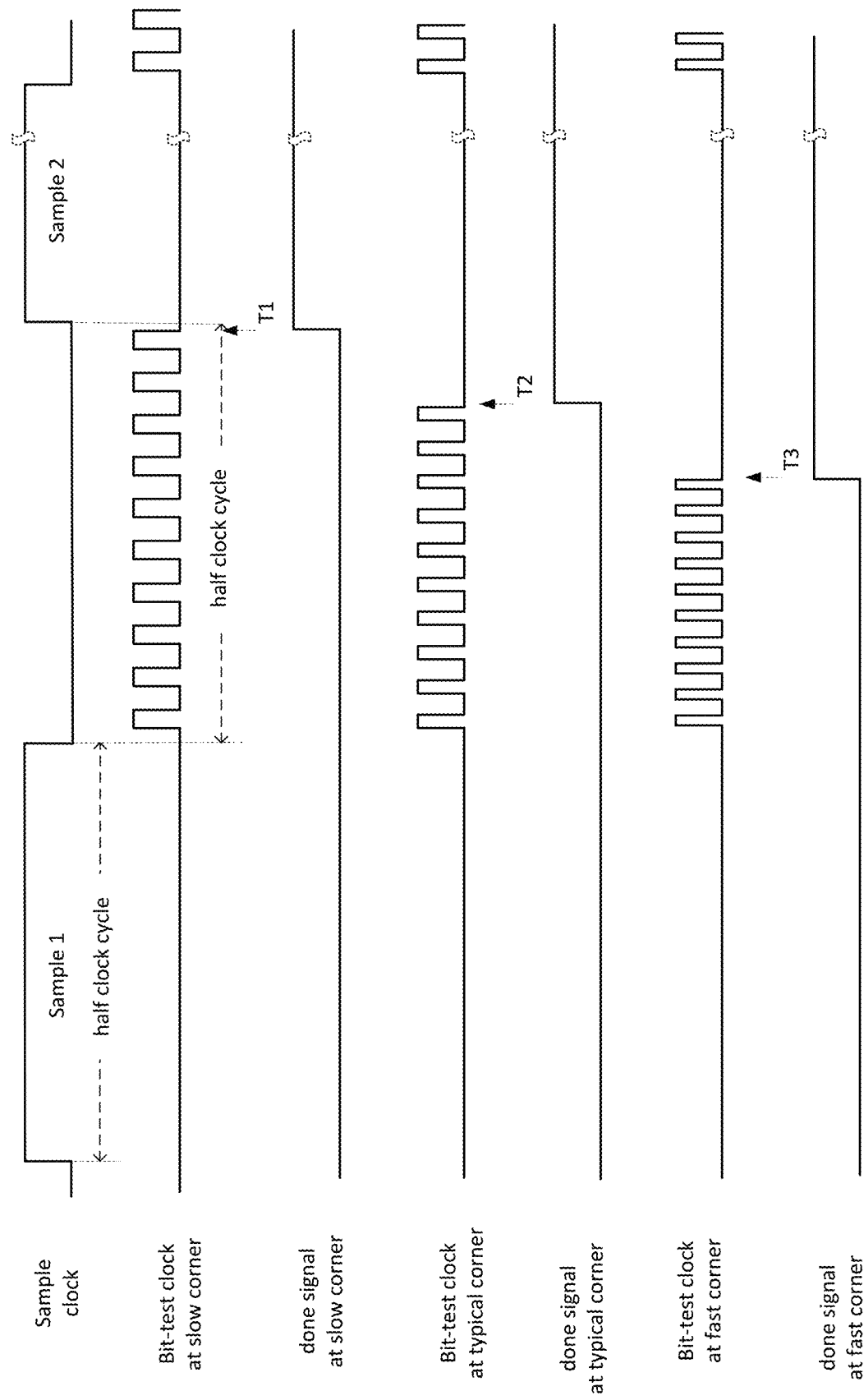
FIG. 4 shows the timing diagram of asynchronous SAR at different process corners
Figure 5:
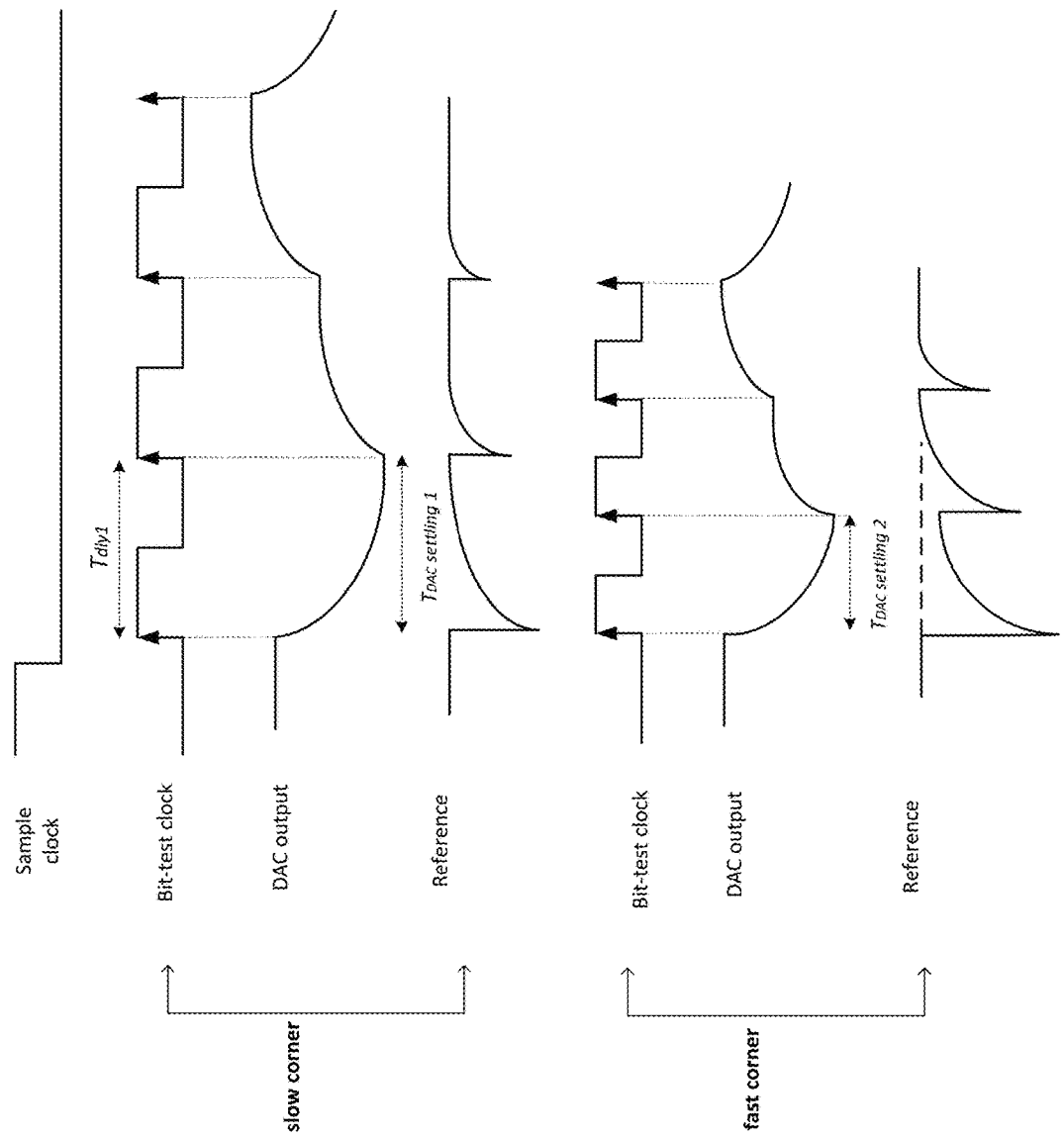
FIG. 5 shows the DAC and Reference settling at slow and fast process corner

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

The terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Furthermore, it is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Similarly, it is to be noticed that the term "coupled" discloses both direct and indirect coupling and should not be interpreted as being restricted to direct connections only. Thus, the scope of the expression "a device A coupled to a device B" should not be limited to devices or systems wherein an output of device A is directly connected to an input of device B. It means that there exists a path between an output of A and an input of B which may be a path including other devices or means.

Figure 6:
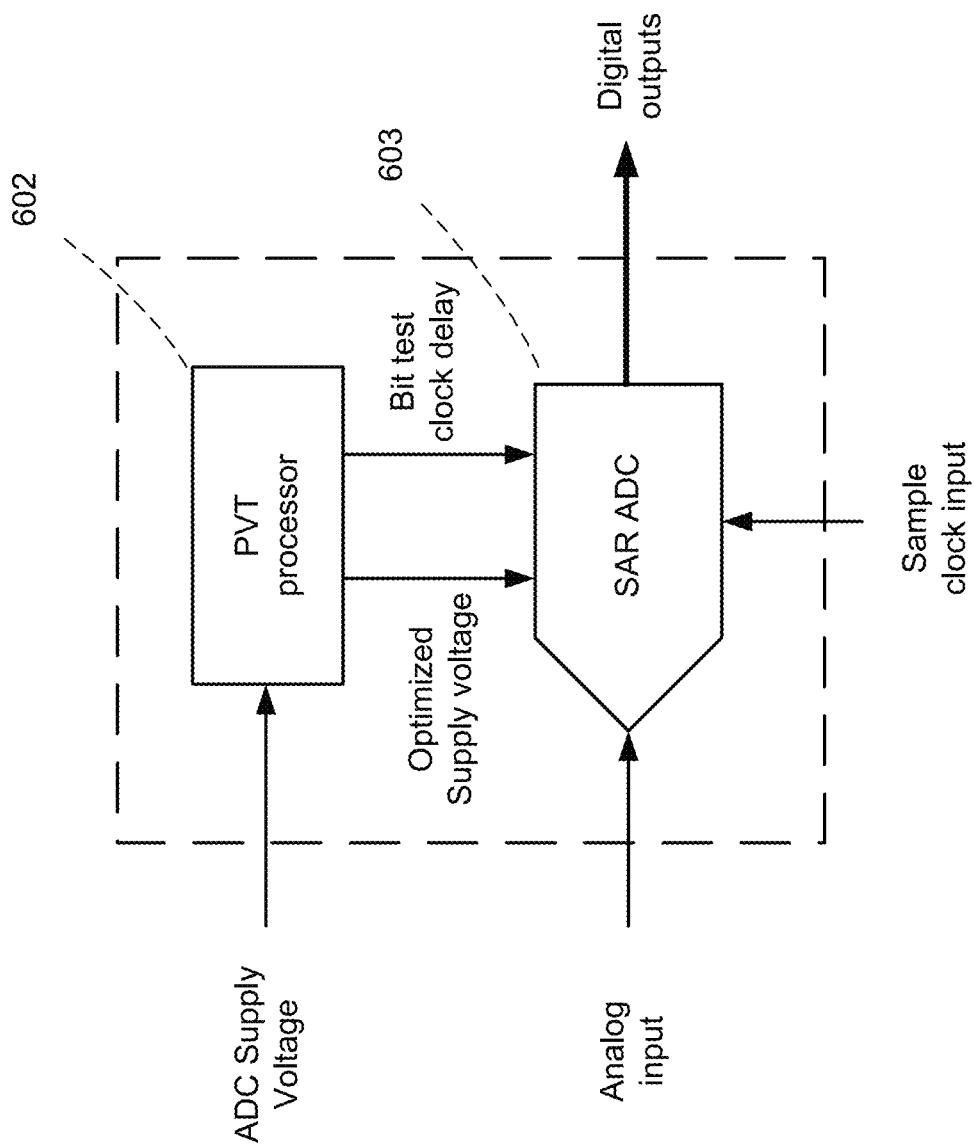
FIG. 6 is the block diagram of proposed PVT optimized SAR ADC

FIG. 6 shows the block diagram of proposed PVT optimized SAR ADC. It consists of PVT processor 602 and SAR ADC 603. PVT processor 602 senses the process, supply voltage and temperature information then process based on the optimization algorithm. PVT processor renders two parameters: optimized supply voltage and bit-test clock delay to ADC, these two parameters adjust the time delay of self-time bit-test clock and maximize the binary search time for better DAC settling and Reference settling response.

Figure 7:
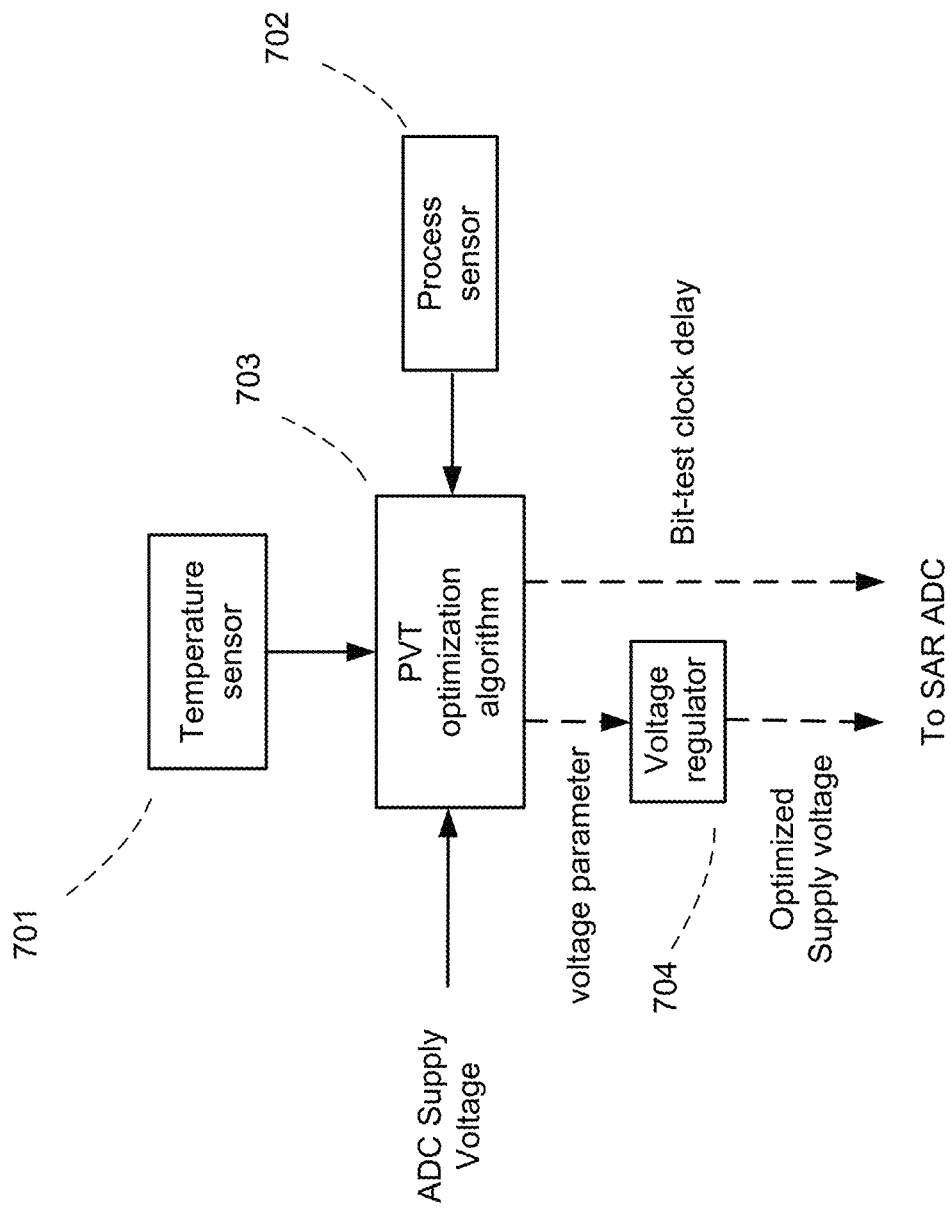
FIG. 7 shows the detailed implementation of PVT processor

FIG. 7 illustrates detailed implementation of PVT processor 602. It consists of Temperature sensor 701, Process sensor 702, PVT optimization algorithm 703 and Voltage regulator 704. Temperature sensor and Process sensor sense the temperature and process information respectively and deliver the variables to PVT optimization algorithm. Based on the three PVT variables, PVT optimization algorithm calculates, processes then renders two parameters. Voltage parameter is delivered to Voltage regulator 704, which generates an optimized supply voltage to ADC. Bit-test clock delay parameter is sent to ADC directly and it adjusts the time delay of self-time bit-test clock.

Figure 8:
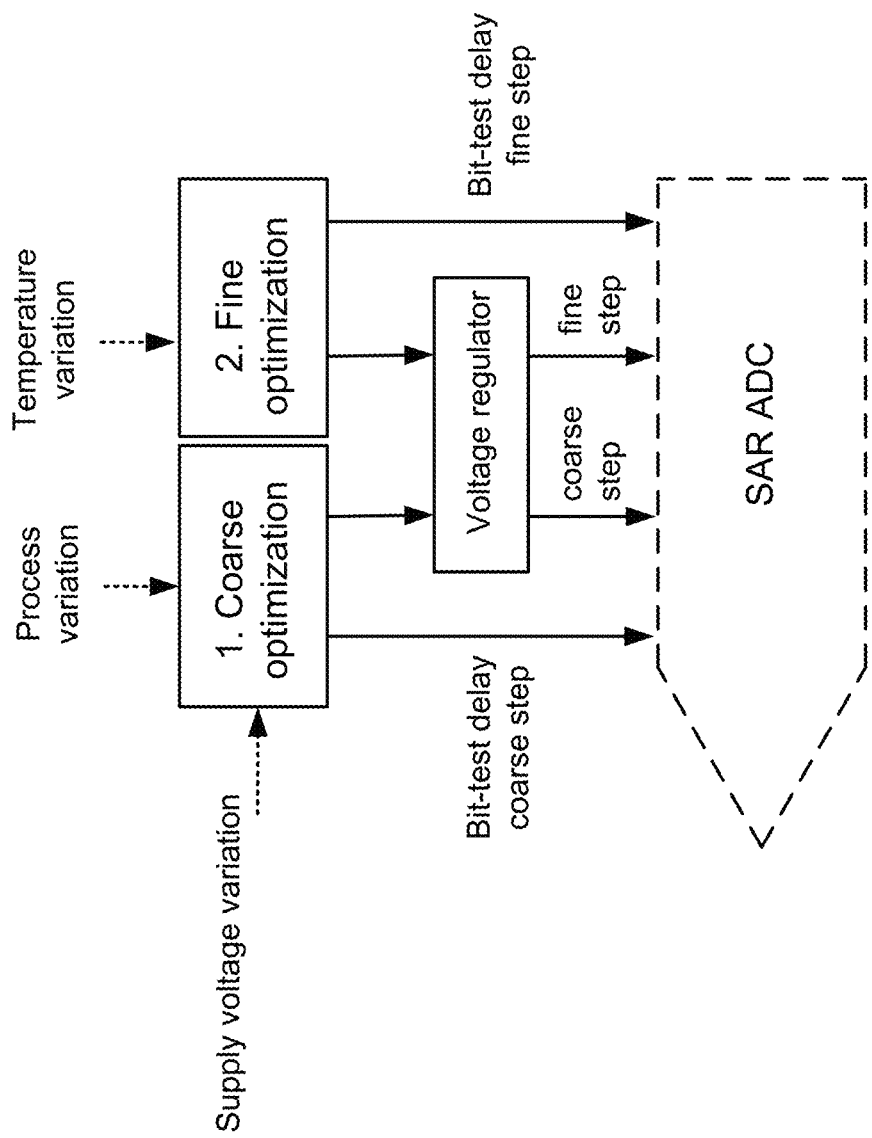
FIG. 8 illustrates the conceptual diagram of PVT optimization algorithm

FIG. 8 illustrates the conceptual diagram of PVT optimization algorithm. It consists of two optimization steps: first coarse optimization and second fine optimization. The first coarse optimization is to address process and supply voltage variation. The second fine optimization is to address temperature variation. Based on the input supply voltage and process sensor information, coarse optimization algorithm adjusts the bit-test clock delay and supply voltage at coarse step to maximize the time for binary search process. The second fine optimization algorithm adjusts the bit-test clock delay and supply voltage at fine step based on the temperature sensor information. Coarse optimization has to be applied before fine optimization for algorithm convergence.

Figure 9:
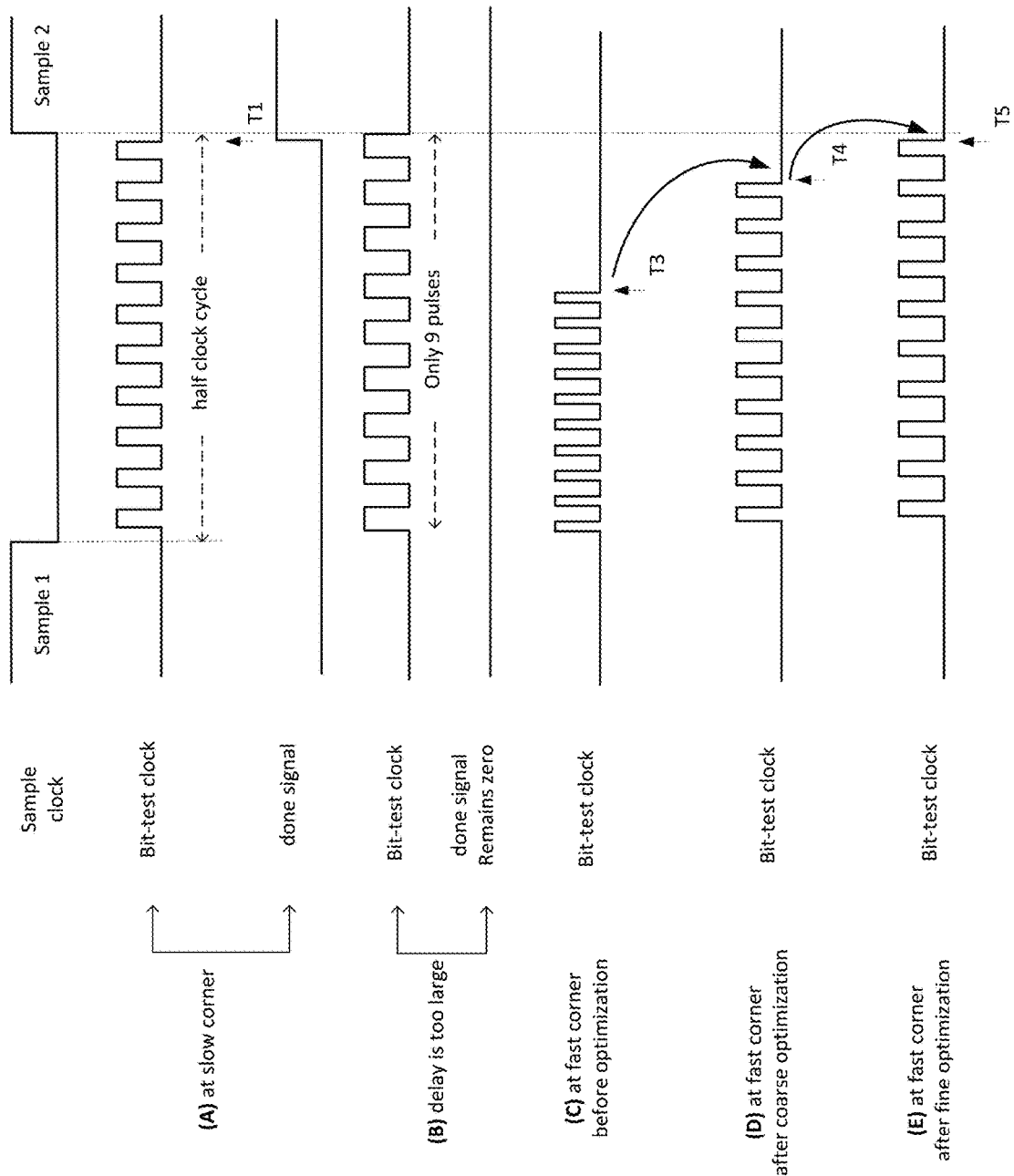
FIG. 9 illustrates the associated timing diagram of PVT optimization algorithm

FIG. 9 illustrates the associated timing diagram of PVT optimization algorithm. A "done" signal is introduced to indicate that the binary search is complete. If the delay of self-time delay element is too large such that the binary search does not finish all the bit tests within half clock cycle, the done signal is not asserted and remain zero as shown on condition (B). Condition (C), (D) and (E) illustrates the bit-test clock before optimization, after coarse optimization and after fine optimization respectively. For fast corner, the done signal is asserted at time T3, which is far away from the next sample time. Coarse optimization algorithm extends the bit-test clock delay then done signal is pushed to a later time then asserted at time T4. Fine optimization algorithm adjusts the delay in a fine step and done signal is asserted even later at time T5, which is near the next sample time. The DAC settling and Reference settling response of condition (E) is much better compared with condition (D) such that ADC can operate at higher conversion rate with less power consumption and achieve better Figure of Merit (FOM).

Figure 10:
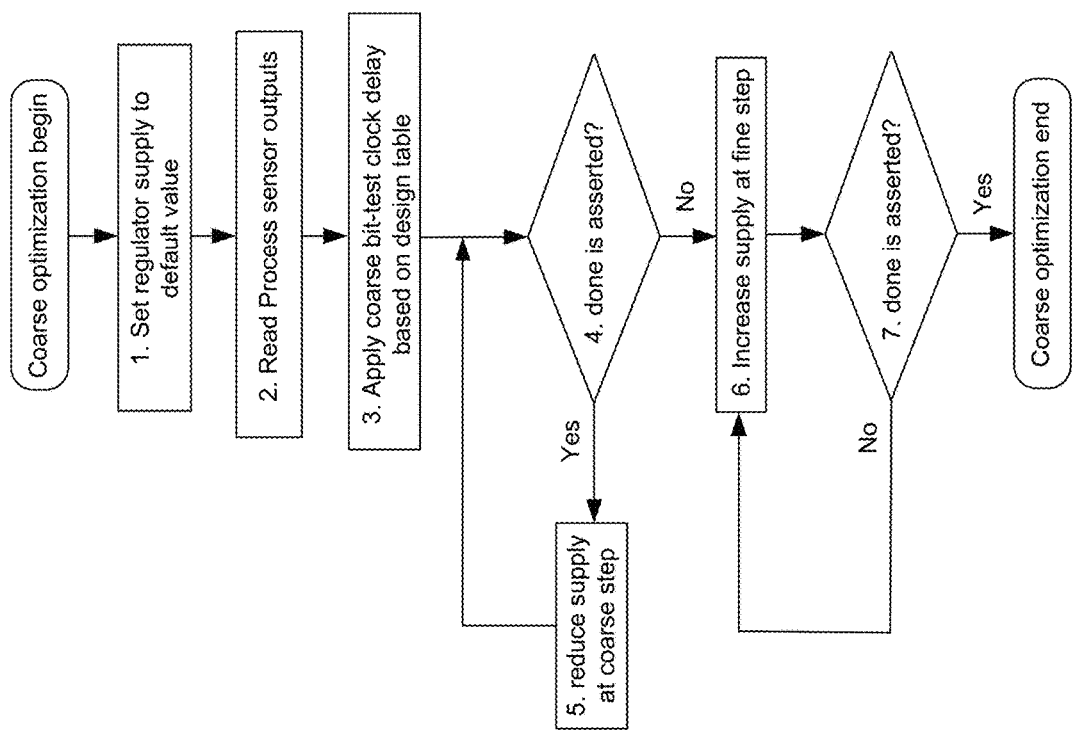
FIG. 10 is the procedure flow chart of coarse optimization algorithm

FIG. 10 is the procedure flow chart of coarse optimization algorithm. Once coarse optimization is started, the voltage regulator is set at its default value, which is a fixed predominate voltage by design. Then process sensor output is captured and the bit-test clock delay is applied to SAR ADC based on a design table. Step 4 is to check if done signal is asserted or not. If yes, the supply is reduced by one coarse step and the procedure returns. If no, then it proceeds to step 6, which increases supply by one fine step. After that, the done signal is checked again and the supply continues to increase at fine step. The coarse optimization ends when done signal is asserted. The purpose of first decision step 4 is to ensure that the delay is large enough that done signal is not asserted as shown on FIG. 9 condition (B). Then the algorithm increases the supply to reduce the delay till done signal is asserted wherein the optimized time delay is achieved.

Figure 11:
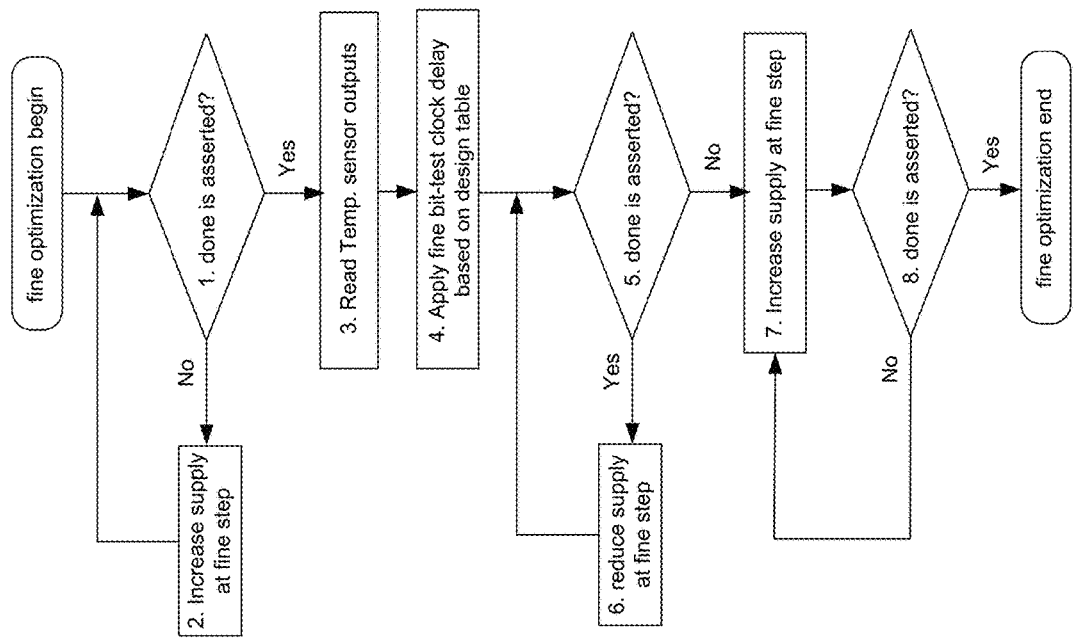
FIG. 11 is the procedure flow chart of fine optimization algorithm

The temperature of integrated circuit (IC) drifts with respect to the operation condition and environment. The fine optimization can be applied frequently to ensure the SAR ADC is operated at its optimized scenario. FIG. 11 is the procedure flow chart of fine optimization algorithm. The first step is a sanity check to assure that the done signal is asserted. If not, supply is increased at fine step till done signal is asserted. Then temperature sensor output is captured and the fine bit-test clock delay is applied to SAR ADC based on a design table. Step 5 and 6 reduces supply at fine step to extend the delay such that done signal is not asserted. Step 7 then starts increasing supply at fine step. Fine optimization ends when done signal is asserted again. The decision on step 5 and 8 can be executed multiple times and averaged to avoid any spontaneously erroneous results.

Figure 12:
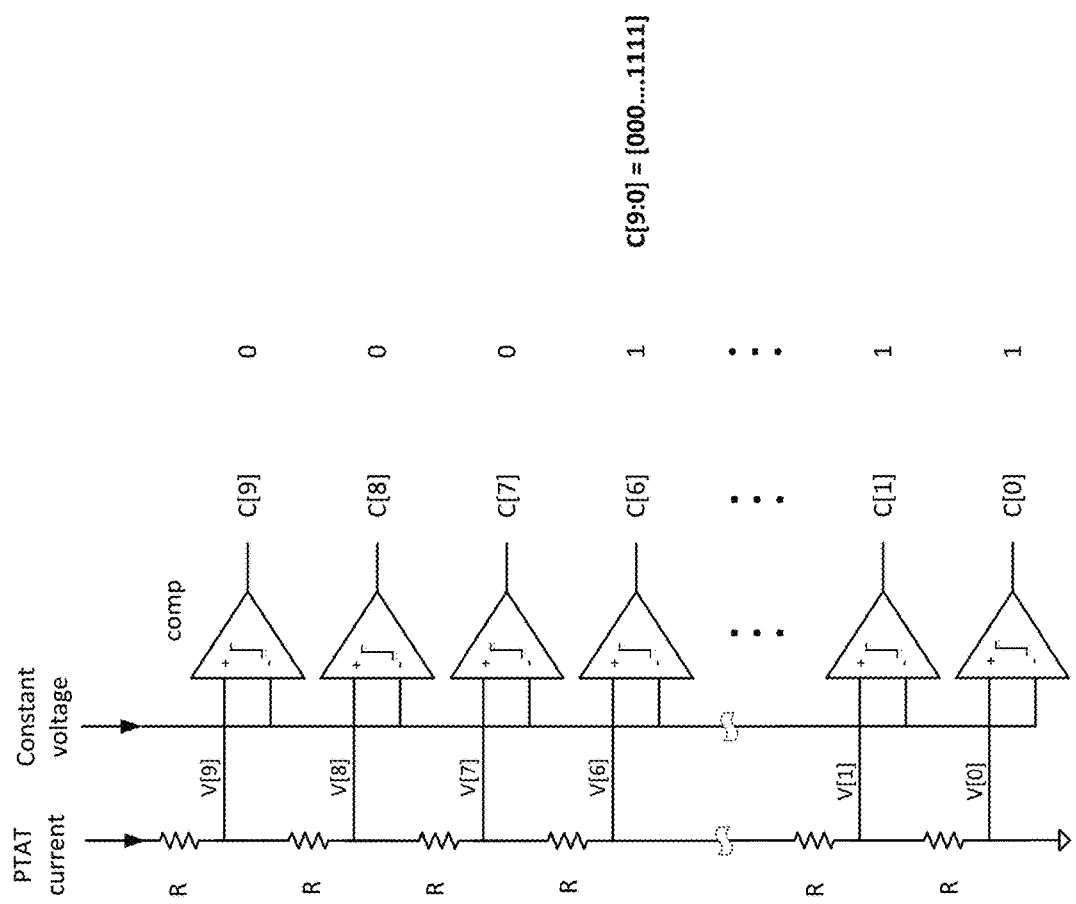
FIG. 12 illustrates the exemplary implementation of Temperature sensor

FIG. 12 illustrates the exemplary implementation of Temperature sensor 701. A predominated Proportional to Absolute Temperature (PTAT) current is coupled to a series of resistor elements. A voltage is created when the current is fed into each resistor element. Voltage from low to high V[0], V[1], V[2] . . . V[9] are generated correspondingly on each resistor element. Each voltage is coupled to a comparator. The other inputs of comparators are all coupled to a predominated constant voltage. By arranging the PTAT current amount and constant voltage, the comparator output at the bottom is "1" and the comparator output on the top is "0". The comparator output C[9:0] is a thermometer code dependent on the temperature. With higher temperature, more comparators trip to "1" state due to higher PTAT current. The thermometer code C[9:0] is a direct indicator of the temperature. By applying more comparator and resistor elements, temperature sensor achieves finer resolution.

Figure 13:
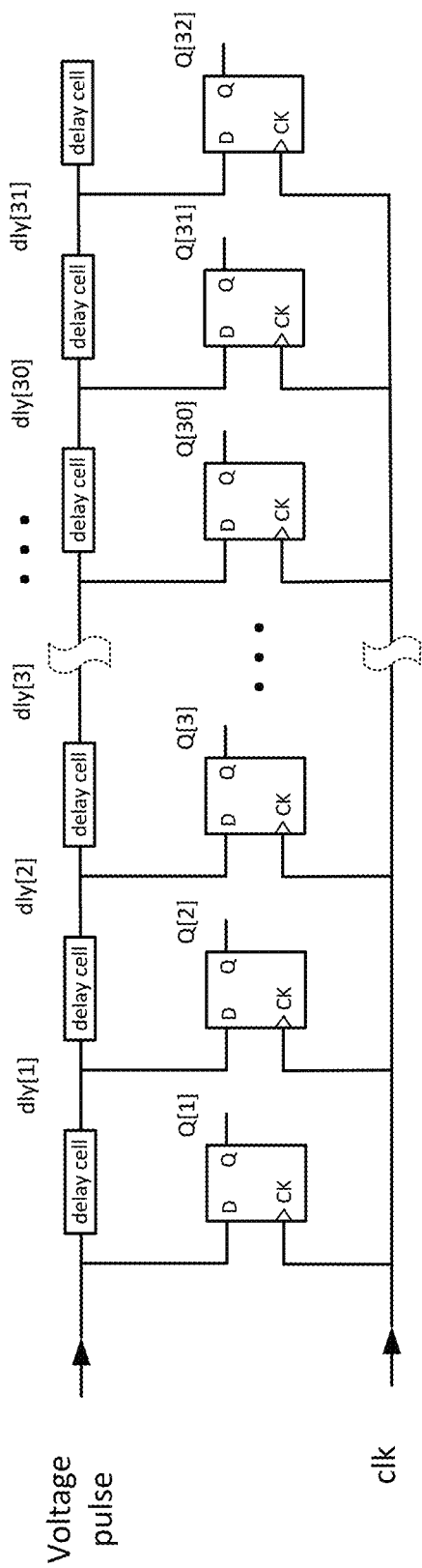
FIG. 13 illustrates the exemplary implementation of Process sensor
Figure 14:
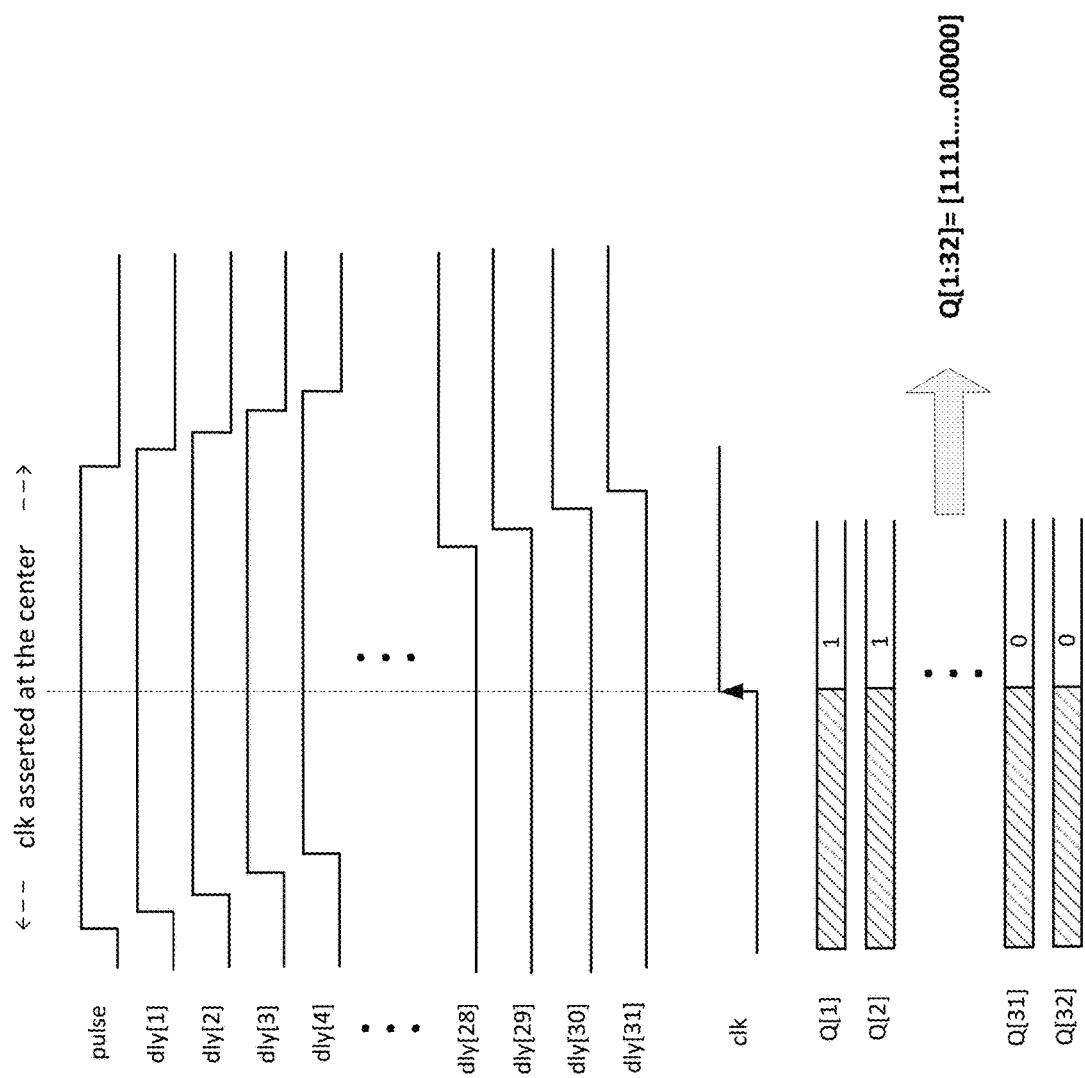
FIG. 14 shows the timing diagram of Process sensor implementation

FIG. 13 illustrates the exemplary implementation of Process sensor 702. A series of flip-flop registers are coupled and connected. A voltage pulse is coupled to a series of delay cell elements. The flip-flop inputs are coupled to each corresponding delay cell respectively. The clock inputs of all flip-flops are all connected together. Its corresponding timing diagram and waveform are illustrated on FIG. 14. A pulse signal is asserted and it passes through the delay cell elements. Each delay cell introduces a small time delay, hence the delay cell develops more delay going from dly[1], dly[2], dly[3] . . . to final dly[31]. The clock input clk is destined to be asserted at the center of time delay dly[1:31]. For the delay cells wherein the timing is ahead of asserted clk, the flip-flop output is 1. For the delay cells wherein the timing is later than asserted clk, the flip-flop output is 0. The flip-flop outputs Q[1:32] is a stream of 1 and 0. For typical process corner, the number of "1" equals the number of "0" when clk is asserted at the center of time delay dly[1:31]. For slow process corner scenario, the delay cells develop more delay, hence the number of "0" is greater than the number of "1". For fast process corner scenario, the delay cells develop less delay, hence the number of "0" is smaller than the number of "1". The number of "1" or "0" is a direct representation of time delay due to process variation. The process sensor resolution achieves finer with more number of flip-flop and delay cell elements.

For asynchronous or self-time SAR ADC, the internal bit-test clock period is dependent to the process, voltage and temperature (PVT) conditions. By setting the bit-test clock delay to one specific process condition, SAR ADC performance is inefficient and compromised to one particular process condition. The proposed PVT processor comprising temperature sensor, process sensor, voltage regulator and PVT optimization algorithm applies coarse optimization to correct the voltage and process variation then applies fine optimization to correct temperature variation. By adjusting the bit-test clock delay and supply voltage, the time for binary search is maximized and DAC and Reference settling is enhanced. This results in better SAR ADC performance and Figure of Merit (FOM).

What is claimed is:

1. A converter, comprising:
    a Successive Approximation Register Analog-to-Digital Converter (SAR ADC); and
    a Process, Voltage and Temperature (PVT) processor coupled with the SAR ADC to enhance asynchronous self-time ADC performance; wherein the processor performs coarse optimization and fine optimization, wherein the coarse optimization corrects process and supply voltage variation by adjusting coarse bit-test clock delay and supply voltage; and wherein the fine optimization corrects temperature variation by adjusting fine bit-test clock delay and supply voltage, and wherein the coarse optimization first sets a regulator voltage based on ADC supply voltage; then sets a coarse bit-test clock delay based on the process sensor, then decreases a supply voltage at the coarse step to deassert the done signal and then increases the supply voltage to assert the done signal to obtain an optimized time delay.

2. The converter of claim 1, wherein PVT processor comprises a temperature sensor, a process sensor, a PVT optimization code, and voltage regulator, wherein the temperature sensor and the process sensor render information to the PVT optimization code to set variables to control voltage regulator and SAR ADC.

3. The converter of claim 1, comprising a PVT optimization code that of adjusts the bit-test clock delay of self-time asynchronous SAR ADC and the supply voltage to maximize the time of binary search process to enhance DAC and Reference settling response.

4. The converter of claim 1, comprising a PVT optimization code for coarse optimization and fine optimization, wherein the coarse optimization corrects process and supply voltage variation by adjusting coarse bit-test clock delay and supply voltage; and wherein the fine optimization corrects temperature variation by adjusting fine bit-test clock delay and supply voltage.

5. The converter of claim 1, comprising a PVT optimization code that introduces a done signal to check the status of the binary search process, wherein the done signal check is repeated to avoid spontaneously erroneous result.

6. The converter of claim 4, comprising a coarse optimization followed by a fine optimization to assure PVT optimization algorithm convergence, wherein a plurality of fine optimization are executed to maintain an optimization status of SAR ADC.

7. The converter of claim 4, comprising a coarse optimization that first sets a regulator voltage based on ADC supply voltage; then sets a coarse bit-test clock delay based on the process sensor, then decreases a supply voltage at the coarse step to deassert the done signal and then increases the supply voltage to assert the done signal to obtain an optimized time delay.

8. The converter of claim 4, comprising a fine optimization that includes setting the fine bit-test clock delay based on temperature sensor; decreasing supply at fine step to deassert the done signal and then increasing the supply voltage at a fine step to assert done signal to obtain an optimized time delay.

9. The converter of claim 2, wherein the process sensor comprises a series of delay elements and flip-flops, wherein the delay elements are coupled to flip-flops, the clock input of flip-flops are all coupled together, wherein a voltage pulse is asserted and the clock is asserted at the center of the delay elements time delay, the number of "1" and "0" of flip-flops outputs represents process delay information.

10. The converter of claim 2, wherein temperature sensor comprises a series of resistor elements and comparators, a Proportional to Absolute Temperature (PTAT) current, and constant voltage inputs, wherein the PTAT current is coupled to the resistor elements and comparators, and the constant voltage is coupled to a second comparator input and a second comparator output is a thermometer code representing a temperature condition.

11. A method for data conversion, comprising:
applying a Process, Voltage and Temperature (PVT) processor and performing coarse optimization and fine coarse optimization;
adjusting a bit-test clock delay and supply voltage based on the optimization;
performing Successive Approximation Register Analog to Digital Conversion (SAR ADC) with a predetermined ADC reference settling based on the adjusted bit-test clock delay and supply voltage; and
performing coarse optimization and fine optimization, wherein the coarse optimization corrects process and supply voltage variation by adjusting coarse bit-test clock delay and supply voltage; and wherein the fine optimization corrects temperature variation by adjusting fine bit-test clock delay and supply voltage, and wherein the coarse optimization first sets a regulator voltage based on ADC supply voltage; then sets a coarse bit-test clock delay based on the process sensor, then decreases a supply voltage at the coarse step to deassert the done signal and then increases the supply voltage to assert the done signal to obtain an optimized time delay.

12. The method of claim 11, wherein PVT processor comprises a temperature sensor, a process sensor, a PVT optimization code, and a voltage regulator, comprising using the temperature sensor and the process sensor information to set variables to control the voltage regulator.

13. The method of claim 11, comprising adjusting the bit-test clock delay of self-time asynchronous SAR ADC and the supply voltage to minimize a binary search time to enhance DAC and Reference settling response.

14. The method of claim 11, comprising controlling a done signal to check the status of the binary search process, wherein the done signal check is repeated to avoid spontaneously erroneous result.

15. The method of claim 11, wherein the coarse optimization is applied first and followed by a fine optimization to assure PVT optimization convergence, wherein a plurality of fine optimization are executed to maintain an optimization status of SAR ADC.

16. The method of claim 11, wherein the fine optimization comprises setting the fine bit-test clock delay based on temperature sensor; decreasing supply at fine step to deassert the done signal and then increasing the supply voltage at a fine step to assert done signal to obtain an optimized time delay.

17. The method of claim 12, wherein the process sensor comprises a series of delay elements and flip-flops, wherein the delay elements are coupled to flip-flops, the clock input of flip-flops are all coupled together, wherein a voltage pulse is asserted and the clock is asserted at the center of the delay elements time delay, the number of "1" and "0" of flip-flops outputs represents process delay information.

18. The method of claim 12, wherein temperature sensor comprises a series of resistor elements and comparators, a Proportional to Absolute Temperature (PTAT) current, and constant voltage inputs, wherein the PTAT current is coupled to the resistor elements and comparators, and the constant voltage is coupled to a second comparator input and a second comparator output is a thermometer code representing a temperature condition.

* * * * *